US008513950B2

(12) United States Patent
Tanabe (10) Patent No.: US 8,513,950 B2
(45) Date of Patent: Aug. 20, 2013

(54) CURRENT SENSOR (75) Inventor: Yasuhito Tanabe, Chita-gun (JP)

(73) Assignee: Denso Corporation, Kariya (JP)

( * ) Notice: Subject to any disclaimer, the term of this patent is extended or adjusted under 35 U.S.C. 154(b) by 258 days.

(21) Appl. No.: 13/026,710

(22) Filed: Feb. 14, 2011

(65) Prior Publication Data

US 2011/0199091 A1 Aug. 18, 2011

(30) Foreign Application Priority Data

Feb. 12, 2010 (JP) ................. 2010-028683

(51) Int. Cl.
*G01N 27/416* (2006.01)
(52) U.S. Cl.
USPC ........................................ 324/426
(58) Field of Classification Search
USPC .............. 324/76.11, 522, 691, 600, 426, 427, 324/433, 430
See application file for complete search history.

(56) References Cited

U.S. PATENT DOCUMENTS

| 5,992,240 | A | 11/1999 | Tsuruoka et al. | |
|---|---|---|---|---|
| 7,491,097 | B2* | 2/2009 | Ishihara et al. | 439/763 |
| 7,746,027 | B2* | 6/2010 | Imamura et al. | 320/104 |
| 7,835,156 | B2* | 11/2010 | Kubokawa et al. | 361/760 |
| 2004/0089545 | A1 | 5/2004 | Kawase et al. | |
| 2006/0057899 | A1* | 3/2006 | Tokunaga | 439/754 |
| 2006/0216800 | A1* | 9/2006 | Ishihara et al. | 435/135 |
| 2008/0224544 | A1* | 9/2008 | Koyama | 307/104 |
| 2009/0132188 | A1 | 5/2009 | Watanabe | |

FOREIGN PATENT DOCUMENTS

| JP | A-UM-H04-012012 | 1/1992 |
|---|---|---|
| JP | A-6-261540 | 9/1994 |
| JP | A-H09-203681 | 8/1997 |
| JP | A-2000-194456 | 7/2000 |
| JP | A-2001-91602 | 4/2001 |
| JP | A-2002-62341 | 2/2002 |
| JP | A-2004-205488 | 7/2004 |
| JP | A-2005-188945 | 7/2005 |
| JP | A-2005-227072 | 8/2005 |
| JP | A-2007-139549 | 6/2007 |
| JP | A-2009-053164 | 3/2009 |
| JP | A-2009-122056 | 6/2009 |

OTHER PUBLICATIONS

Apr. 2, 2013 Office Action issued in Japanese Patent Application No. 2010-028683 (with English Translation).
Jun. 18, 2013 Office Action issued in Japanese Patent Application No. 2010-028683 (with translation).

* cited by examiner

*Primary Examiner* — Edward Tso
(74) *Attorney, Agent, or Firm* — Oliff & Berridge, PLC (57) ABSTRACT

A current sensor, which senses current passing through a harness via a terminal of a battery, includes a fixed part to which the harness is fixed, a resistor which is inserted between the terminal and the fixed part, a circuit board which measures current passing through the resistor based on a potential difference between two positions along the direction in which current is passed through the resistor, and a case which accommodates the resistor and the circuit board. The circuit board includes a plurality of amplifiers which amplify potential difference between the two positions, an analog-digital converter which converts output voltages of the amplifiers into digital data of a predetermined number of bits, and a current measuring/processing unit which measures current passing through the resistor based on the digital data outputted from the analog-digital converter.

9 Claims, 7 Drawing Sheets

CURRENT SENSOR

CROSS-REFERENCE TO RELATED APPLICATION

This application is based on and claims the benefit of priority from earlier Japanese Patent Application No. 2010-028683 filed Feb. 12, 2010, the description of which is incorporated herein by reference.

BACKGROUND

1. Technical Field

The present invention relates to a current sensor that senses charge/discharge current of a battery installed such as in a passenger car or a truck.

2. Related Art

Current sensors have been known. Such known current sensors include battery charge/discharge current sensors as disclosed in JP-A-2009-122056. The battery charge/discharge current sensor disclosed in JP-A-2009-122056 is configured to sense the charge/discharge current of a battery based on voltage across a current sensing resistor inserted between the negative terminal of the battery and a ground. In this battery charge/discharge current sensor, measured currents are summed to calculate the remaining amount of battery, and the calculated value is displayed.

Battery monitors have also been known as disclosed in JP-A-2000-194456. The battery monitor disclosed in JP-A-2000-194456 is provided with two resistors connected in series to sense current. When a normal current flow is measured with these resistors, only one of the resistors is used with the other one of the resistors being short-circuited across its ends. When a very small current flow is measured with these resistors, both of the two resistors are used.

In the current sensor disclosed in JP-A-2009-122056, the voltage across the terminals of the current sensing resistor is amplified with a predetermined gain and the amplified voltage is inputted to an analog-digital converter. It is true that, when the gain is made larger in this current sensor, the resolution is scaled up to thereby enable measurement of very small currents. However, measurement of large currents is disabled in this case because the full range is reduced. It is also true that, when the gain is made smaller in this current sensor, the full range becomes larger to thereby enable measurement of large current. However, in this case, the resolution is scaled down and hence the accuracy of measuring very small currents is lowered.

In particular, in a battery installed in a motor vehicle, the dynamic range of required charge/discharge current greatly depends on the travel status of the vehicle, as a characteristic of such a motor vehicle. For example, approximately 300 A is required in measuring current in a state of starting the engine (engine start-up status) of such a motor vehicle, while only several tens of milliamperes are required in measuring current when the vehicle is in a status of being parked (parked status). In this way, it has been difficult to measure current in all travel statuses of such a motor vehicle, and to perform accurate control of the vehicle. More specifically, an attempt to measure a current flow in a parked status using the configuration of measuring the current in an engine start-up status has resulted in insufficient resolution. Thus, it has been difficult to accurately measure current in a parked status of such a motor vehicle using the configuration for the engine start-up status.

In the battery monitor disclosed in JP-A-2000-194456, one of the resistors is required to be short-circuited across its ends using a switch in measuring large current. When this type of battery monitor is applied to the measurement of charge/discharge current of an on-vehicle battery, the reliability of the switch will not be ensured because large current flows through the starter in an engine start-up status of the vehicle. Thus, this type of battery monitor has not been applicable to the measurement of charge/discharge current of an on-vehicle battery.

SUMMARY

An embodiment provides a current sensor which is able to measure current including very small current and large current with high accuracy.

As an aspect of the embodiment, a current sensor, which senses current passing through a harness via a terminal of a battery, includes: a fixed part to which the harness is fixed; a resistor which is inserted between the terminal and the fixed part; a circuit board which measures current passing through the resistor based on a potential difference between two positions along the direction in which current is passed through the resistor; and a case which accommodates the resistor and the circuit board, wherein the circuit board includes a plurality of amplifiers which amplify potential difference between the two positions, an analog-digital converter which converts output voltages of the amplifiers into digital data of a predetermined number of bits, and a current measuring/processing unit which measures current passing through the resistor based on the digital data outputted from the analog-digital converter.

BRIEF DESCRIPTION OF THE DRAWINGS

In the accompanying drawings.

DETAILED DESCRIPTION OF THE PREFERRED EMBODIMENTS

With reference to the accompanying drawings, hereinafter is described an embodiment of a current sensor.

Figure 1:
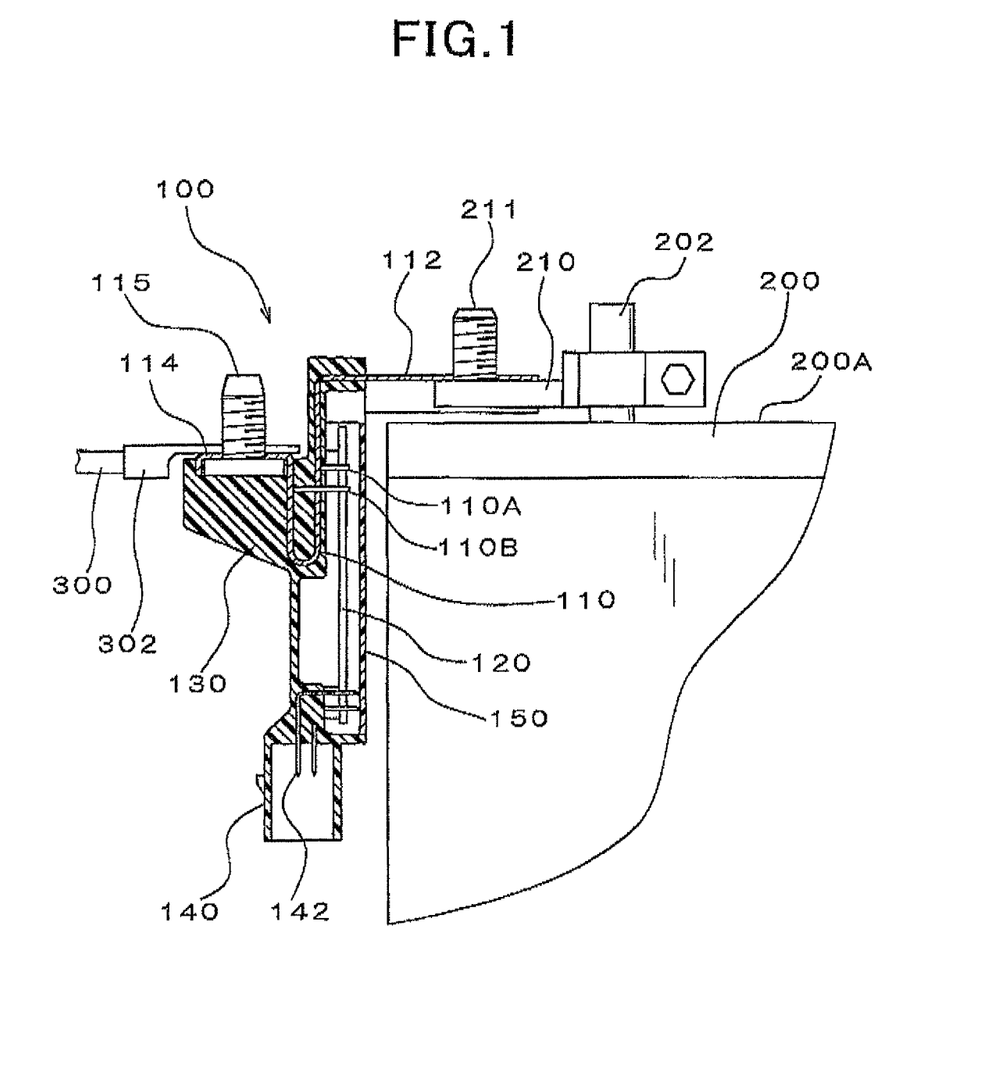
FIG. 1 is a cross-sectional view illustrating a configuration of a current sensor according to an embodiment.
Figure 2:
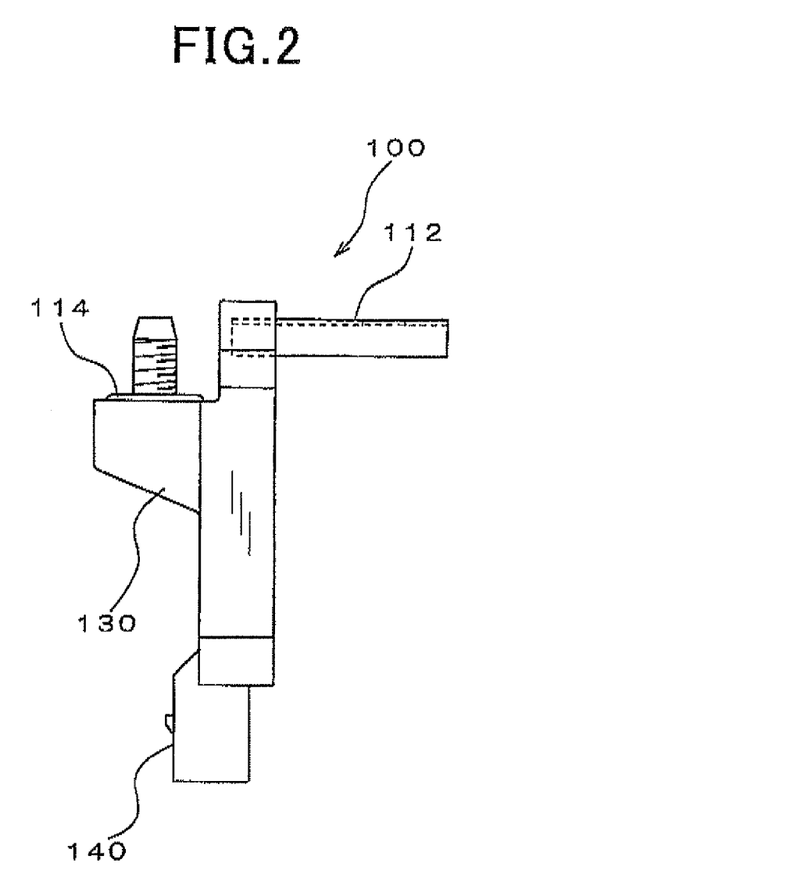
FIG. 2 is a side view illustrating the current sensor.
Figure 3:
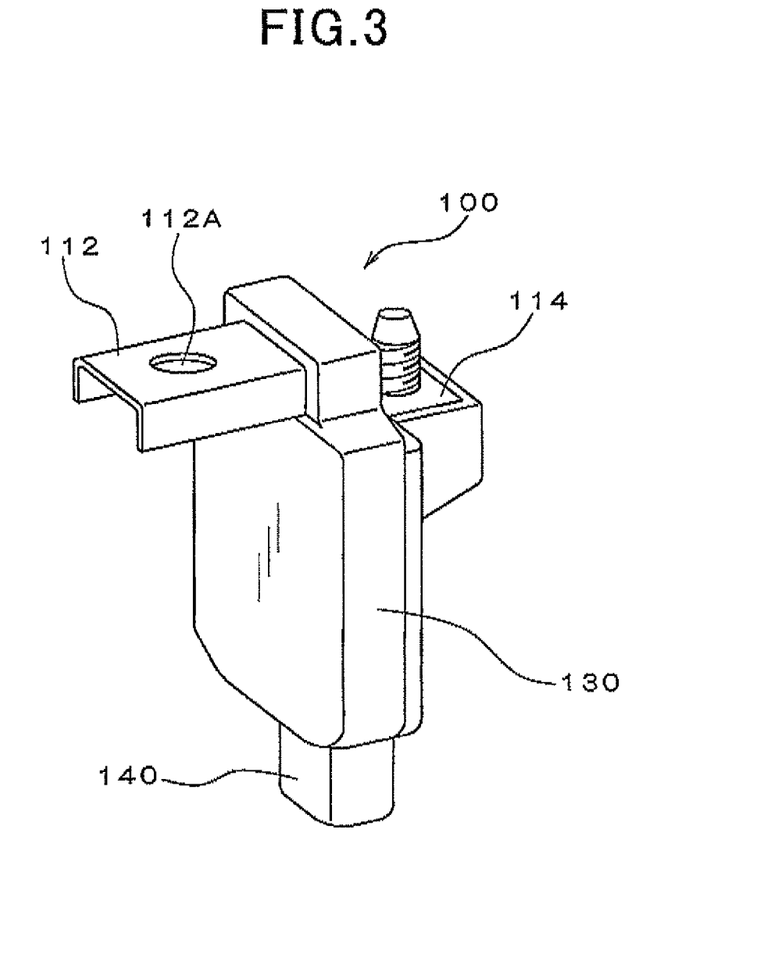
FIG. 3 is a perspective view illustrating the current sensor.

FIG. 1 is a cross-sectional view illustrating a configuration of a current sensor 100 according to the embodiment. FIG. 1 shows a state where the current sensor 100 is attached to a battery of a motor vehicle. FIG. 2 is a side view illustrating the current sensor 100 and FIG. 3 is a perspective view illustrating the current sensor 100.

As shown in these figures, the current sensor 100 of the present embodiment includes a bus bar 110, a circuit board 120, a case 130, a connector 140 and a cover 150. The bus bar 110 is made of an electrically conductive material and serves as a resistor (shunt resistor). The circuit board 120 is mounted with a current measuring/processing unit which measures current passing through the bus bar 110 based on a potential difference between two positions along the direction in which current is passed through the bus bar 110. The case 130 accommodates the bus bar 110 and the circuit board 120. The connector 140 is provided with a plurality of connector terminals 142 exposed inside thereof to establish electrical connection between the connector 140 and the circuit board 120. The cover 150 covers an opening of a recess of the case 130 in which the circuit board 120 is accommodated.

The bus bar 110 is bent in the case 130 so as to have a U-shaped form. The bus bar 110 has one end which is fixed to wiring (battery terminal) on the side of a battery 200 to form a first fixed part 112 for establishing electrical connection. The bus bar 110 has the other end to which a harness is fixed to form a second fixed part 114 for establishing electrical connection. The battery 200 has a side face (closest to a negative terminal 202 of the battery 200, to which the current sensor 100 is attached) in the vicinity of which the case 130 having a substantially rectangular parallelepiped shape is disposed being elongated in the longitudinal direction. The first and second fixed parts 112 and 114 are horizontally projected in both directions with the longitudinally elongated case 130 being interposed therebetween.

The first fixed part 112 has a U-shaped cross section turned sideways. The first fixed part 112 having the U-shaped cross section has a bottom surface at a portion of which a through hole 112A (see FIG. 3) is formed. As shown in FIG. 1, a metal bracket 210 is attached to the negative terminal 202 of the battery 200 to attach the current sensor 100 thereto. The metal bracket 210 also serves as wiring between the negative terminal 202 and the first fixed part 112. The metal bracket 210 has an end portion from which a bolt 211 is projected upward. In the present embodiment, the bolt 211 of the metal bracket 210 is inserted into the through hole 112A of the U-shaped first fixed part 112 from the side of an opening of a recess of the U-shaped first fixed part 112. The inserted bolt 211 is tightened up with a nut (not shown) for fixation of the first fixed part 112 to the metal bracket 210.

The second fixed part 114 has an end portion in the vicinity of which a through hole is provided, with a bolt 115 being inserted therethrough. The second fixed part 114 is electrically connected with a harness 300 having an end portion which is provided with a terminal 302 having a through hole. The bolt 115 provided at the second fixed part 114 is inserted into the through hole of the terminal 302 to tighten the terminal 302 with a nut (not shown), so that the terminal 302 is fixed to the second fixed part 114.

In the present embodiment, the case 130 is made of a resin material having good insulation properties and high heat conductivity, such as PPS (polyphenylene sulfide) resin. Most part of the bus bar 110 is insert-molded with the resin except the portion exposed outside as the first fixed part 112 or the second fixed part 114.

Figure 4:
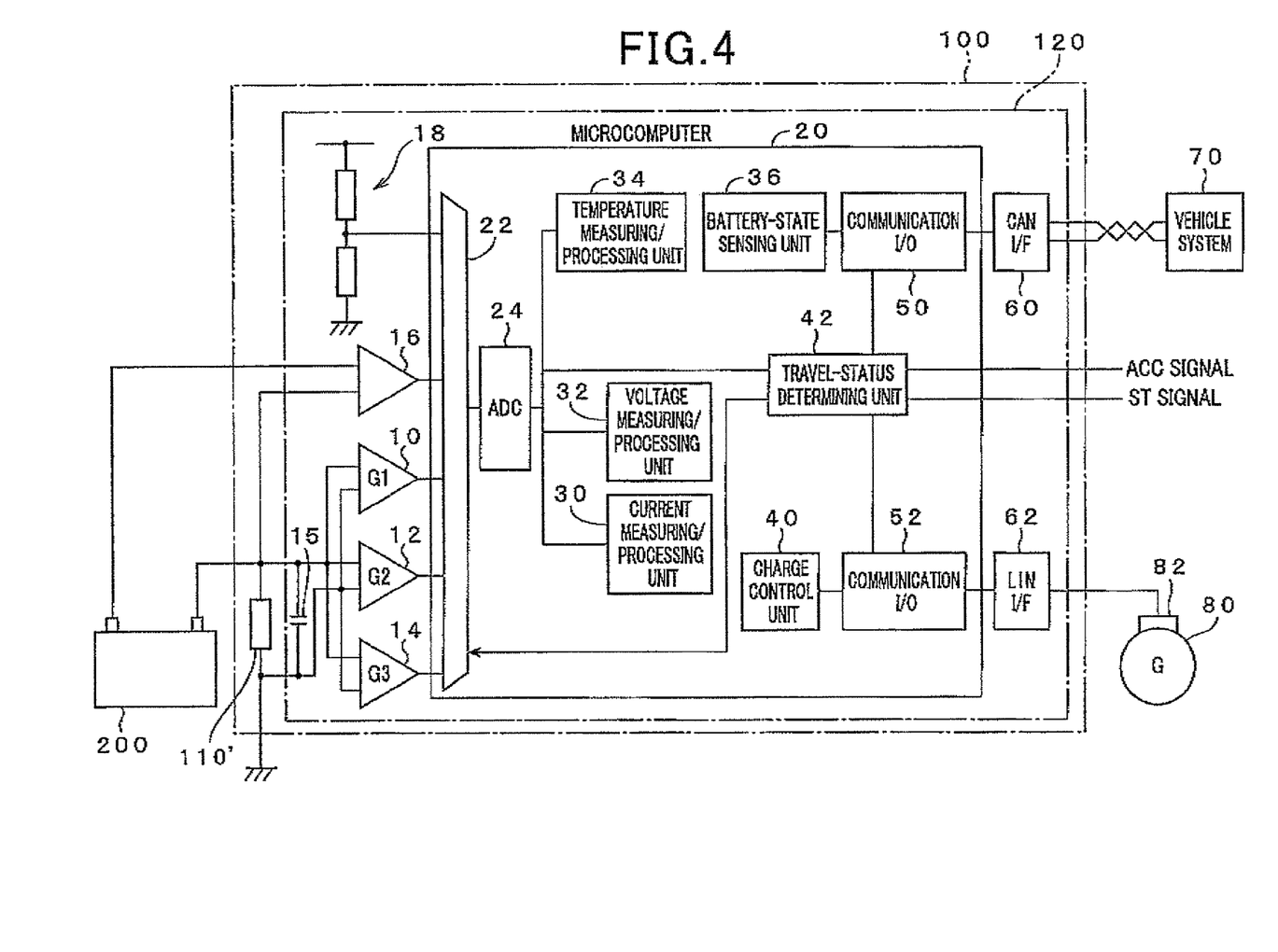
FIG. 4 is a block diagram illustrating a specific example of a circuit of the current sensor and an example of connecting the circuit such as to a battery.

FIG. 4 is a block diagram illustrating a specific example of a circuit of the current sensor 100 and an example of connecting the circuit such as to the battery 200. As shown in FIG. 4, the current sensor 100 is provided with a circuit board 120 that includes a shunt resistor 110', differential amplifiers 10, 12 and 14, a capacitor 15, a differential amplifier 16, a temperature sensor 18, a microcomputer 20, a CAN interface (CAN I/F) 60 and a LIN interface (LIN I/F) 62. The shunt resistor 110' is formed by a part of the bus bar 110. The differential amplifiers 10, 12 and 14 are each connected to both ends of the shunt resistor 110'. The capacitor 15 is used for removing noise. The differential amplifier 16 is connected to the positive terminal and the negative terminal of the battery 200. The CAN I/F 60 transmits/receives data according to a CAN (controller area network) protocol. The LIN I/F 62 transmits/receives data, according to a LIN (local interconnect network) protocol.

The differential amplifier 10 amplifies the voltage across the shunt resistor 110' with a first gain G1. The differential amplifier 12 amplifies the voltage across the shunt resistor 110' with a second gain G2. The differential amplifier 14 amplifies the voltage across the shunt resistor 110' with a third gain G3. The differential amplifier 16 converts the voltage across the battery 200 (battery voltage) into a voltage of a proper level. The temperature sensor 18 is configured by a voltage divider circuit that includes a resistor and a thermistor. The resistance of the thermistor changes with the change of temperature to change the divided voltage of the voltage divider circuit. The capacitor 15 is connected in parallel to the shunt resistor 110' across the terminals thereof.

The microcomputer 20 introduces output voltage for the differential amplifiers 10, 12, 14 and 16 and the temperature sensor 18 and measures charge/discharge current of the battery 200, the voltage across the battery 200 and the temperature of the battery 200. The microcomputer 20 determines the state of the battery 200 using the results of the measurements and also performs various processes, such as generation control of a vehicle generator (G) 80. For this purpose, the microcomputer 20 includes a multiplexer 22, ADC (analog-digital converter) 24, current measuring/processing unit 30, voltage measuring/processing unit 32, temperature measuring/processing unit 34, battery-state sensing unit 36, charge control unit 40, vehicle travel-status determining unit 42 (hereinafter just referred to as "travel-status determining unit 42"), communication input/output unit (communication I/O) 50 and communication input/output unit (communication I/O) 52.

The multiplexer 22 selects one of output voltages of the so differential amplifiers 10, 12, 14 and 16 and the temperature sensor 18 and inputs the selected output voltage to the ADC 24. The ADC 24 converts the inputted voltage into digital data of a predetermined number of bits (e.g., 10 bits). In the present embodiment, extractors (110A and 110B of FIG. 1) for extracting potential difference across the shunt resistor 110' are disposed near the input terminals of the amplifiers 10, 12 and 14.

The current measuring/processing unit 30 measures current passing through the shunt resistor 110' based on digital data that corresponds to the output voltage of any one of the differential amplifiers 10, 12 and 14. The voltage measuring/processing unit 32 measures battery voltage based on digital data that corresponds to the output voltage of the differential amplifier 16. The temperature measuring/processing unit 34 measures temperature of the current sensor 100 (temperature of the battery 200), based on digital data that corresponds to the output voltage (divided voltage) of the temperature sensor 18.

The battery-state sensing unit 36 obtains measurement values from the current measuring/processing unit 30, voltage measuring/processing unit 32 and temperature measuring/processing unit 34 to produce a battery-state signal. A battery-state sensor is configured by the current measuring/processing unit 30, voltage, measuring/processing unit 32, temperature measuring/processing unit 34 and the battery-state sensing unit 36.

The travel-status determining unit 42 determines the travel status (engine start-up status, running status including idling status, or parked status) of the vehicle equipped with the current sensor 100. Specific determining operation will be described later.

The charge control unit 40 controls the state of electric generation of the vehicle generator 80 based on the battery-state signal produced by the battery-state sensing unit 36. This electric generation control is performed by transmitting an instruction from the charge control unit 40 to a generation controller 82 installed in the vehicle generator 80 via the communication I/O 52 and the LIN I/F 62. The battery-state signal produced by the battery-state sensing unit 36 is transmitted to a vehicle system 70 via the communication I/O 50 and the CAN I/F 60. The vehicle system 70 integrally controls the engine and various electrical loads based such as on the received battery-state signal.

In the present embodiment, the three differential amplifiers 10, 12 and 14 are appropriately switched according to the travel status of the vehicle in order to measure current by the current measuring/processing unit 30. Specifically, the differential amplifier 10 is used in an engine start-up status of the vehicle. The first gain G1 of the differential amplifier 10 is set to a proper value that falls within a range in which a maximum value of the current passing at the time of starting the starter does not overflow with respect to the 10-bit data of the ADC 24. The differential amplifier 12 is used in a running status including an idling status of the vehicle. The second gain G2 of the differential amplifier 12 is set to a value larger than the first gain G1 of the differential amplifier 10 by a factor of 2 to 5. The differential amplifier 14 is used during the parking of the vehicle. The differential amplifier 14 is used in a parked status of the vehicle. The third gain G3 of the differential amplifier 14 is set to a value larger than the first gain G1 of the differential amplifier 10 by a factor of 10 to 100. These three differential amplifiers 10, 12, 14 are switched by the multiplexer 22 in the microcomputer 20. The switching is performed under the control of the travel-status determining unit 42 based on an ACC (accessory) signal indicative of an on/off state of an ACC (accessory) switch and an ST (starter) signal indicative of an on/off state of a ST (starter) switch.

Figure 5:
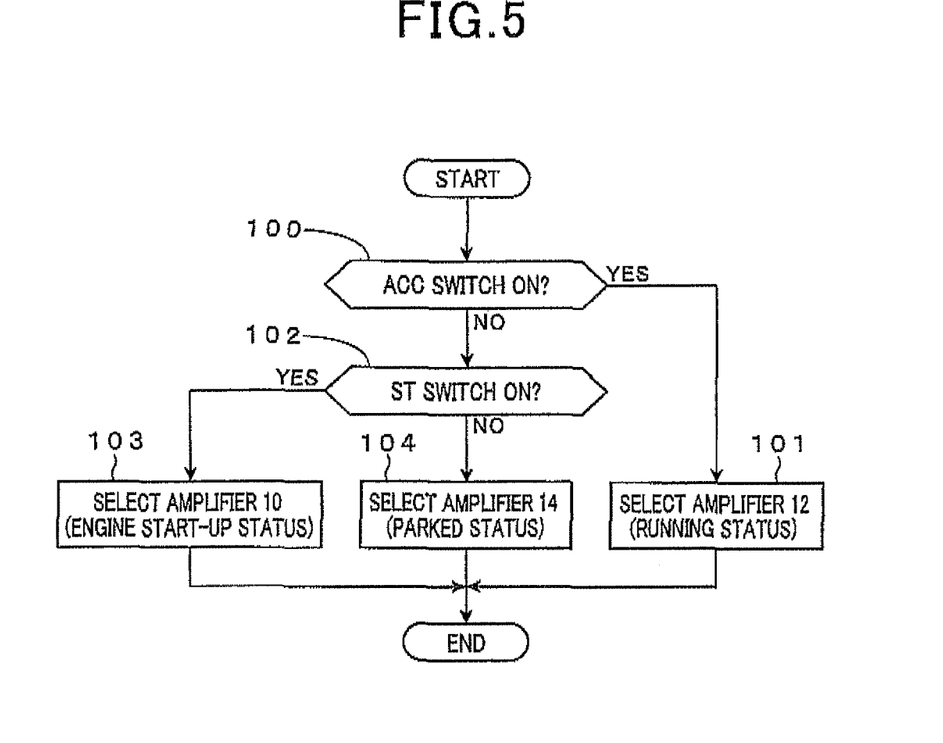
FIG. 5 is a flow diagram illustrating an amplifier switching process for measuring current.

FIG. 5 is a flow diagram illustrating an amplifier switching process for measuring current. The travel-status determining unit 42 determines whether or not the ACC switch has been turned on, based on the ACC signal (step 100). When the ACC switch has been turned on, the travel-status determining unit 42 makes a positive determination, selects the output voltage of the differential amplifier 12, which corresponds to the running status of the vehicle, via the multiplexer 22 to use the output voltage (step 101).

When the ACC switch has not been turned on, a negative determination is made at step 100. Subsequently, the travel-status determining unit 42 determines whether or not the ST switch has been turned on based on the ST signal (step 102). If the ST switch has been turned on, the travel-status determining unit 42 selects the output voltage of the differential amplifier 10, which corresponds to the engine start-up status of the vehicle, via the multiplexer 22 to use the output voltage (step 103).

When the ST switch has not been turned on, a negative determination is made at step S102. Subsequently, the travel-status determining unit 42 selects the output voltage of the differential amplifier 14, which corresponds to the parked status of the vehicle, via the multiplexer 22 to use the output voltage (step 104). In this way, one of the output voltages of the three differential amplifiers 10, 12 and 14 is selected based on the ACC signal and the ST signal to measure the current passing through the shunt resistor 110'.

As described above, the current sensor 100 of the present embodiment uses three amplifiers to select one of these three amplifiers depending on the magnitude of the current to be measured. Thus, current ranging from very small current to large current can be accurately measured. Further, the capacitor 15 is disposed in the vicinity of the extractors 110A and 110E for extracting potential difference between two positions of the shunt resistor 110'. In this case, the capacitor 15 is disposed near the input terminals of the amplifier 10, 12 and 14. Thus, the length of the wiring between the shunt resistor 110' and each of the amplifiers 10, 12 and 14 is shortened. In addition, noise is removed using the capacitor 15 to thereby suppress deterioration in the current measurement accuracy as much as possible, which deterioration would be caused due to the mixing of noise. Further, use of the single ADC 24 for the three amplifiers 10, 12 and 14 eliminates the necessity of correcting a conversion error which would have been caused at each of a plurality of ADCs if these are used. Thus, the processing load such as of the current measuring/processing unit 30 is reduced.

Further, the configuration of the above embodiment enables switching between the amplifiers 10, 12 and 14 depending on the travel status of the vehicle without detecting whether or not the output voltage of each of the amplifiers 10, 12 and 14 has overflowed. Thus, the time taken for switching is reduced. Also, the amplifiers 10, 12 and 14 are switched according to the states of the ACC switch and the ST switch. Thus, the amplifiers 10, 12 and 14 are switched using an existing switch without detecting whether or not the output voltage of each of the amplifiers 10, 12 and 14 has overflowed. Thus, the time taken for switching is reduced and the cost increase is suppressed, which increase would be caused by performing switching and making a determination on the overflow.

In the embodiment described above, the second gain G2 of the amplifier 12 is set to a value larger than the first gain G1 of the amplifier 10 by a factor of 2 to 5, while the third gain G3 of the amplifier 14 is set to a value larger than the first gain G1 of the amplifier 10 by a factor of 10 to 100. Thus, a current value can be measured with an appropriate accuracy, the current being estimated according to each of the travel statuses.

Further, the gains G1, G2 and G3 of the three amplifiers 10, 12 and 14, respectively, have been ensured to be different from each other. Thus, the ranges of measuring current using the amplifiers can be made different from each other (e.g., measurement range in the parked status is from −5 A to +5 A, measurement range in the running status is from −100 A to +100 A, and measurement range in the engine start-up status is from −300 A to +300 A). Moreover, these measurement ranges are partially overlapped with each other. Therefore, when any one of the three amplifiers 10, 12 and 14 is in failure, a failure determination can be made based on the results of measurements using the output voltages of the three amplifiers (This failure determination is performed by the current measuring/processing unit 30, for example), whereby reliability is improved.

Figure 6:
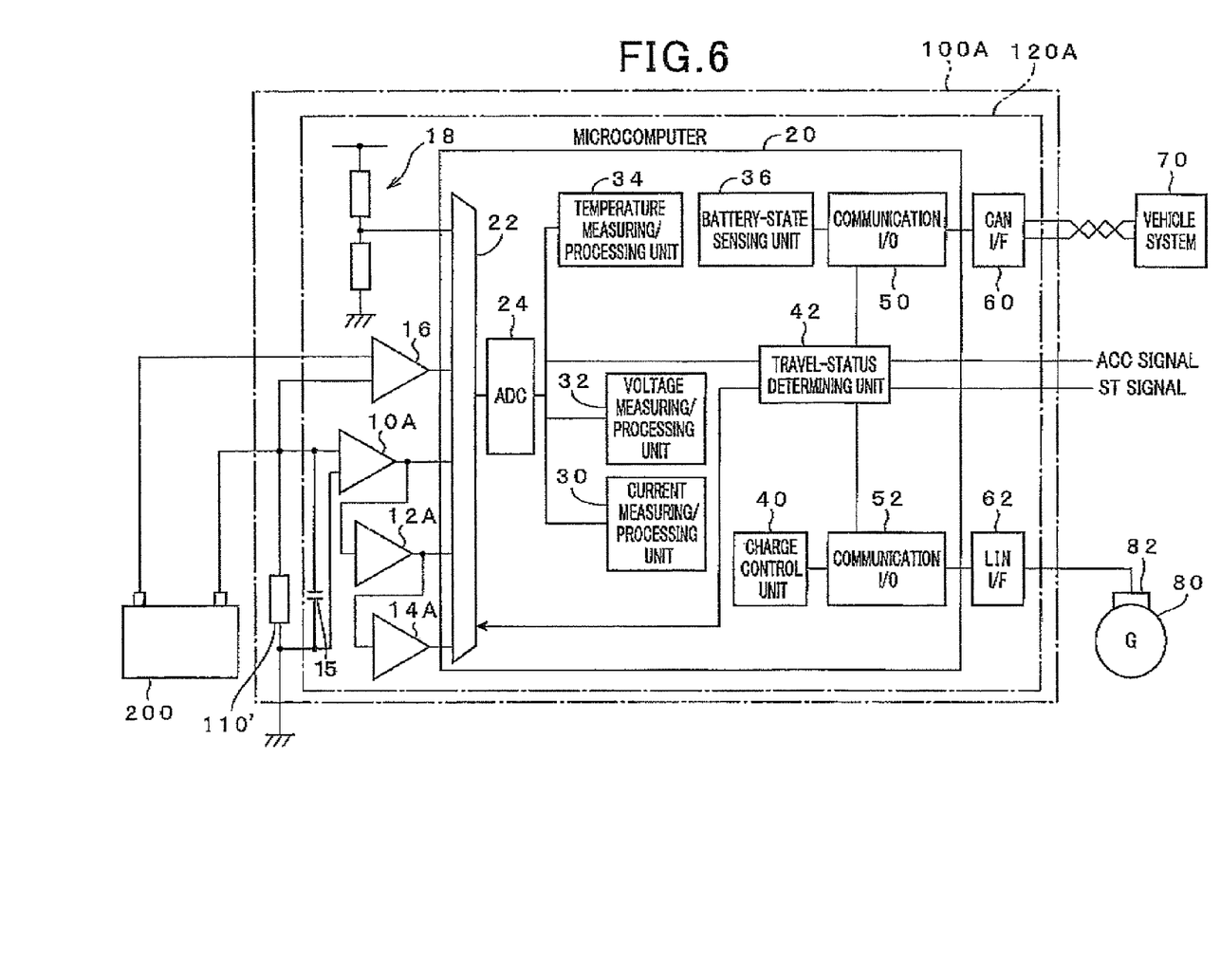
FIG. 6 is a block diagram illustrating a modification of the current sensor.

FIG. 6 is a block diagram illustrating a current sensor 100A which is a modification of the current sensor 100 of the above embodiment illustrated in FIG. 4. In this modification, the components identical with or similar to those in the above embodiment described above are given the same reference numerals for the sake of omitting explanation.

Comparing with the current sensor 100 illustrated in FIG. 4, the current sensor 100A illustrated in FIG. 6 is provided with a circuit board 120A in place of the circuit board 120 of FIG. 4. The circuit board 120A uses serially connected three differential amplifiers 10A, 12A and 14A instead of the three parallelly connected differential amplifiers of FIG. 4. The output voltages of the three amplifiers 10A, 12A and 14A are parallelly inputted to the multiplexer 22. The gain of the amplifier 10A is set so as to be equal to the first gain G1 of the differential amplifier 10 shown in FIG. 4. The gain of the amplifier 12A provided at the subsequent stage is set so that the total gain of the two amplifiers 10A and 12A will be equal to the second gain G2 of the differential amplifier 12 shown in FIG. 4. Further, the gain of the amplifier 14A provided at the final stage is set so that the total gain of the three amplifiers 10A, 12A and 14A will be equal to the third gain G3 of the differential amplifier 14 shown in FIG. 4. In such serially connected amplifiers 10A, 12A and 14A, the gain of the downstream amplifiers 12A and 14A can be made small and therefore the operations of the amplifiers 12A and 14A are stabilized.

Figure 7:
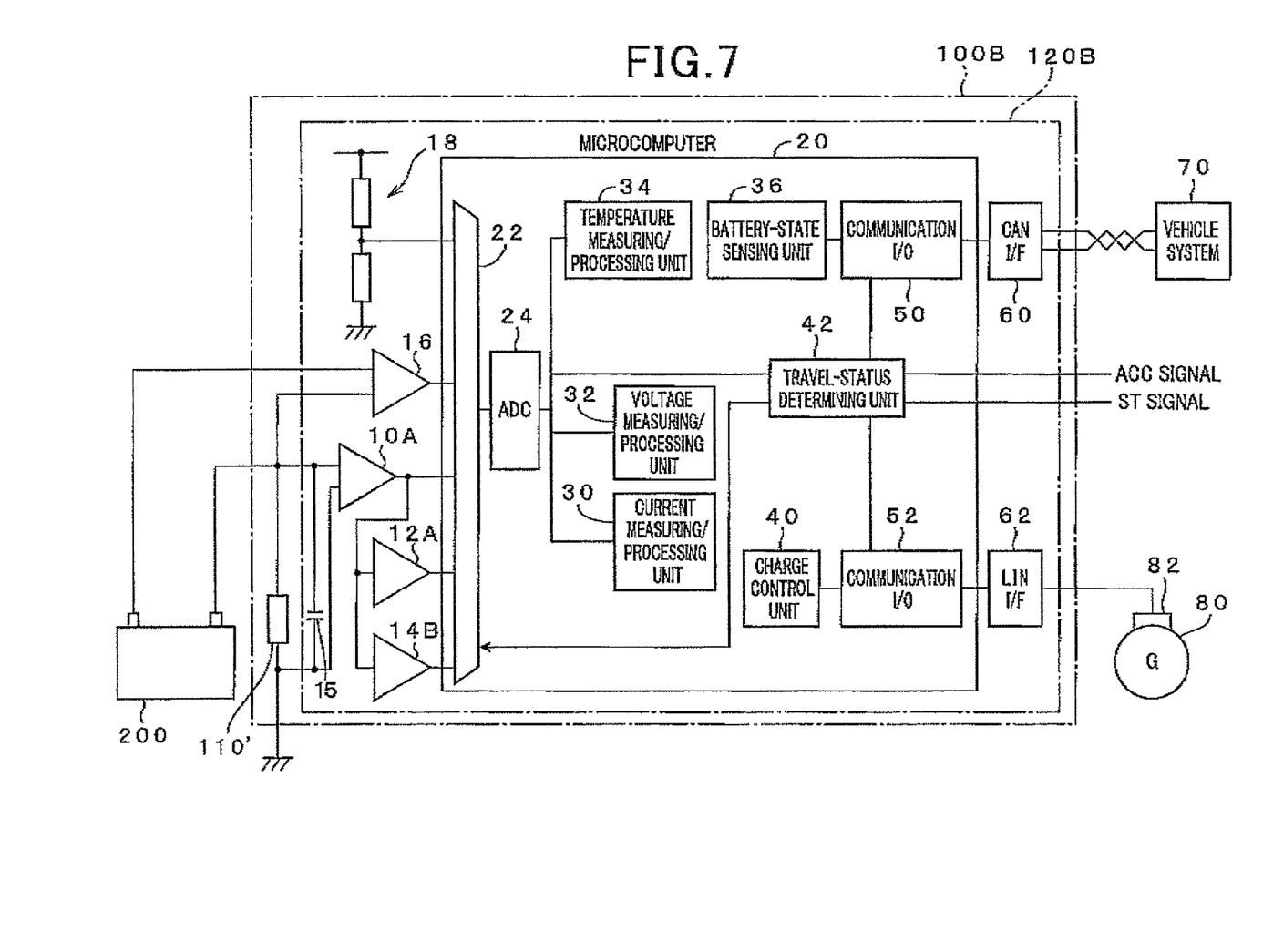
FIG. 7 is a block diagram illustrating another modification of the current sensor.

FIG. 7 is a block diagram illustrating a current sensor 100B which is a modification of the current sensor 100 of the above embodiment illustrated in FIG. 4. In this modification, the components identical with or similar to those in the above embodiment and the above modification are given the same reference numerals for the sake of omitting explanation.

Comparing with the current sensor 100 illustrated in FIG. 4, the current sensor 100B illustrated in FIG. 7 is provided with a circuit board 120B in place of the circuit board 120 of FIG. 4. The circuit board 120B uses the differential amplifier 10A provided at a first stage and two parallelly connected differential amplifiers 12A and 14A provided at the subsequent stage of the amplifier 10A, instead of the three parallelly connected differential amplifiers of FIG. 4. The output voltages of the three amplifiers 10A, 12A and 14B are inputted in parallel to the multiplexer 22. The gains of the amplifiers 10A and 12A are set in a similar manner to the amplifiers 10A and 12A of FIG. 6. The gain of the downstream amplifier 14B is set so that the total gain of the two amplifiers 10A and 14B will be equal to the third gain G3 of the differential amplifier 14 of FIG. 4.

The present invention is not limited to the embodiment described above but may be variously modified without departing from the spirit of the present invention. For example, the current sensor 100 has been connected to the negative terminal 202 of the battery 200. Alternative to this, however, the current sensor 100 may be connected to the positive terminal of the battery 200.

In the embodiment described above, the case 130 of the current sensor 100 has been disposed along one side face of the battery 200, which side face is nearest to the terminal 202. However, the distance between the terminal 202 and the current sensor 100 may sometimes be allowed to be larger to a certain extent depending on the length of the metal bracket 210 or the first fixing part 112. Therefore, the current sensor 100A, for example, may be mounted so that the case 130 is disposed along the other side face of the battery 200.

In the embodiment described above, the opening of the recess of the case 130 in which the circuit board 120 and the like are accommodated has been covered with the cover 150. Alternative to this, the entire recess including the circuit board 120 and the like may be covered by filling the entire recess with a filler, such as an epoxy resin.

In the embodiment described above, the resistor (shunt resistor) has been integrally formed with the bus bar 110. Alternatively, however, the range including at least the two points for measuring potential difference may be replaced by a resistor formed separately from the bus bar 110.

Also, the circuit board 120 may be provided with a memory element that stores a current measurement error as a correction value (default correction value), which error has been measured at the time of shipping the current sensor 100 from the factory. Then, when current is measured after the shipment by the current measuring/processing unit 30, a current measurement error may be corrected based on the default correction value. Thus, the error caused such as by the variation between circuit elements, i.e. the shunt resistor and the amplifiers 10, 12 and 14, can be removed using the default correction value. Owing to this, an inexpensive shunt resistor or circuit elements may be used to thereby reduce the cost of the parts.

In the embodiment described above, the travel-status determining unit 42 has switched the multiplexer 22 based on the ACC signal and the ST signal. Alternative to this, information equivalent to these signals (or information specifying a vehicle status) may be acquired from the vehicle system 70 via the CAN I/F 60, and the multiplexer 22 may be switched based on the acquired information. Alternatively, the information in question may be acquired via the LIN I/F 62 to switch the multiplexer 22 base on the acquired information.

In the embodiment described above, three amplifiers have been used to measure current. Alternatively, however, two or four or more amplifiers may be used for the measurement of current. In the above embodiment, one of the output voltages of the three amplifiers 10, 12 and 14 has been selected by the multiplexer 22 and inputted to the single ADC 24. Alternative to this, however, the output voltages of the three amplifiers 10, 12 and 14 may be separately inputted to three respective ADCs for conversion to digital data, when measurement accuracy alone is focused on.

As described above, the plurality of amplifiers 10, 12 and 14 are used for possible selection of one of the output voltages of these amplifiers depending on the magnitude of the current to be measured. Thus, current ranging from very small current to large current can be measured with high accuracy.

Hereinafter, aspects of the above-described embodiments will be summarized.

As an aspect of the embodiment, a current sensor, which senses current passing through a harness via a terminal of a battery, includes: a fixed part to which the harness is fixed; a resistor which is inserted between the terminal and the fixed part; a circuit board which measures current passing through the resistor based on a potential difference between two positions along the direction in which current is passed through the resistor; and a case which accommodates the resistor and the circuit board, wherein the circuit board includes a plurality of amplifiers which amplify potential difference between the two positions, an analog-digital converter which converts output voltages of the amplifiers into digital data of a predetermined number of bits, and a current measuring/processing unit which measures current passing through the resistor based on the digital data outputted from the analog-digital converter.

Thus, use of the plurality of amplifiers enables selection of a different amplifier depending on the magnitude of the current to be measured. Thus, current ranging from very small current to large current can be measured with high accuracy.

In the current sensor, preferably, the circuit board includes a capacitor disposed in the vicinity of an extractor for extracting potential difference between the two positions from the resistor, and the capacitor is disposed near the amplifier.

Thus, with the arrangement of the capacitor for removing noise in the vicinity of the resistor and with the reduction of the length of the wiring between the capacitor and the amplifiers, deterioration in the current measurement accuracy is suppressed as much as possible, which deterioration would be caused due to the mixing of noise.

In the current sensor, preferably, the plurality of amplifiers have respective gains which are different from each other, and the output voltages of the amplifiers are selectively inputted to the analog-digital converter.

Thus, use of the single analog-digital converter eliminates the necessity of correcting conversion errors which would have been caused in each of a plurality of analog-digital converters if these are used. Thus, the processing load such as of the current measuring/processing unit is reduced.

In the current sensor, preferably, measurement ranges in which the current measuring/processing unit can measure current using the output voltages of the amplifiers are partially overlapped with each other.

Thus, when any one of the amplifiers is in failure, a failure determination can be made based on the results of measurements using the output voltages of the three amplifiers, whereby reliability is improved.

In the current sensor, preferably, the circuit board includes a travel-status determining unit which determines a travel status of a vehicle, the plurality of amplifiers include a first amplifier, a second amplifier, and a third amplifier whose gains are different from each other, the travel-status determining unit selects one amplifier from the plurality of amplifiers based on the determined travel status, and the current measuring/processing unit measures current based on an output voltage of the selected amplifier. Specifically, the travel-status determining unit preferably selects the first amplifier when determining that the travel status is an engine start-up status, selects the second amplifier when determining that the travel status is a running status including an idling status, and selects the third amplifier when determining that the travel status is a parked status.

Thus, the amplifiers can be switched according to the travel status of the vehicle without detecting whether or not the output voltage of each of the amplifiers has overflowed, thereby reducing the time taken for switching.

The travel-status determining unit preferably selects the first amplifier when a starter switch has been turned on, selects the second amplifier when an accessory switch has been turned on, and selects the third amplifier when both the starter switch and the accessory switch have not been turned on.

Thus, the amplifiers are switched using an existing switch without detecting whether or not the output voltage of each of the amplifiers has overflowed. Thus, the time taken for switching is reduced and the cost increase is suppressed, which increase would be caused by performing switching and making a determination on the overflow.

In the current sensor, preferably, the gain of the second amplifier is set to a value larger than the gain of the first amplifier by a factor of 2 to 5, and the gain of the third amplifier is set to a value larger than the gain of the first amplifier by a factor of 10 to 100.

Thus, current (e.g., current of 300 A in the engine start-up status or current of 10 mA in the parked status) can be measured with an appropriate accuracy, the current falling within a range of output voltage estimated according to each of the travel statuses. In particular, when monitoring the current in a parked status of the vehicle in which the engine is stopped, the current will not be influenced by the ignition noise at the time of firing or the noise induced by the motor. Therefore, setting high gain will not cause any influence on the current, leading to measurement of small current with high accuracy.

In the current sensor, preferably, the circuit board includes a memory element that stores a current measurement error as a so correction value, which error has been measured at the time of shipping the current sensor, and the current measuring/processing unit corrects the current measurement error based on the correction value when measuring current.

Thus, the error caused such as by the variation between the resistors or circuit elements can be removed using the default correction value measured at the time of shipment from the factory. Owing to this, inexpensive resistors or circuit elements may be used to thereby reduce the cost of the parts.

What is claimed is:

1. A current sensor which senses current passing through a harness via a terminal of a battery, comprising:
    a fixed part to which the harness is fixed;
    a resistor which is inserted between the terminal and the fixed part;
    a circuit board which measures current passing through the resistor based on a potential difference between two positions along the direction in which current is passed through the resistor; and
    a case which accommodates the resistor and the circuit board, wherein
    the circuit board includes a plurality of amplifiers which amplify potential difference between the two positions, an analog-digital converter which converts output voltages of the amplifiers into digital data of a predetermined number of bits, and a current measuring/processing unit which measures current passing through the resistor based on the digital data outputted from the analog-digital converter.

2. The current sensor according to claim 1, wherein
    the circuit board includes a capacitor disposed in the vicinity of an extractor for extracting potential difference between the two positions from the resistor, and
    the capacitor is disposed near the amplifier.

3. The current sensor according to claim 1, wherein
    the plurality of amplifiers have respective gains which are different from each other, and
    the output voltages of the amplifiers are selectively inputted to the analog-digital converter.

4. The current sensor according to claim 1, wherein
    measurement ranges in which the current measuring/processing unit can measure current using the output voltages of the amplifiers are partially overlapped with each other.

5. The current sensor according to claim 1, wherein
    the circuit board includes a travel-status determining unit which determines a travel status of a vehicle,
    the plurality of amplifiers include a first amplifier, a second amplifier, and a third amplifier whose gains are different from each other,
    the travel-status determining unit selects one amplifier from the plurality of amplifiers based on the determined travel status, and
    the current measuring/processing unit measures current based on an output voltage of the selected amplifier.

6. The current sensor according to claim 5, wherein
    the travel-status determining unit selects the first amplifier when determining that the travel status is an engine start-up status, selects the second amplifier when determining that the travel status is a running status including an idling status, and selects the third amplifier when determining that the travel status is a parked status.

7. The current sensor according to claim 5, wherein
    the travel-status determining unit selects the first amplifier when a starter switch has been turned on, selects the second amplifier when an accessory switch has been turned on, and selects the third amplifier when both the starter switch and the accessory switch have not been turned on.

8. The current sensor according to claim 6, wherein
    the gain of the second amplifier is set to a value larger than the gain of the first amplifier by a factor of 2 to 5, and
    the gain of the third amplifier is set to a value larger than the gain of the first amplifier by a factor of 10 to 100.

9. The current sensor according to claim 1, wherein
the circuit board includes a memory element that stores a current measurement error as a correction value, which error has been measured at the time of shipping the current sensor, and
the current measuring/processing unit corrects the current measurement error based on the correction value when measuring current.

* * * * *